United States Patent

Chan et al.

[11] Patent Number: 6,140,684
[45] Date of Patent: *Oct. 31, 2000

[54] SRAM CELL STRUCTURE WITH DIELECTRIC SIDEWALL SPACERS AND DRAIN AND CHANNEL REGIONS DEFINED ALONG SIDEWALL SPACERS

[75] Inventors: Tsiu Chiu Chan, Carrollton; Frank Randolph Bryant, Denton, both of Tex.

[73] Assignee: STMicroelectronic, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/881,342

[22] Filed: Jun. 24, 1997

[51] Int. Cl.[7] .......................... H01L 29/76; H01L 29/94; H01L 31/062; H01L 31/116
[52] U.S. Cl. ..................... 257/368; 257/903; 257/393; 438/199
[58] Field of Search .................... 257/368, 369, 257/377, 903, 393, 350; 438/199

[56] References Cited

U.S. PATENT DOCUMENTS

| 4,072,974 | 2/1978 | Ipri ............................... 357/23 |
| 4,118,642 | 10/1978 | Richardson ..................... 257/393 |
| 4,178,674 | 12/1979 | Liu et al. ........................ 437/47 |
| 4,180,826 | 12/1979 | Shappir ........................... 437/49 |
| 4,214,917 | 7/1980 | Clark et al. ..................... 437/46 |
| 4,247,915 | 1/1981 | Bartlett ........................... 365/154 |
| 4,290,185 | 9/1981 | McKenny et al. .............. 437/46 |
| 4,367,580 | 1/1983 | Guterman ........................ 437/46 |
| 4,370,798 | 2/1983 | Lien et al. ...................... 437/46 |
| 4,389,481 | 6/1983 | Poleshuk et al. .............. 430/319 |

(List continued on next page.)

FOREIGN PATENT DOCUMENTS

| 0104616 | 4/1984 | European Pat. Off. . |
| 0392540 | 10/1990 | European Pat. Off. . |
| 2503864 | 8/1976 | Germany . |
| 56-26467 | 3/1981 | Japan . |
| 56-61158 | 5/1981 | Japan . |
| 56-83075 | 7/1981 | Japan . |
| 57-192069 | 11/1982 | Japan . |
| 58-135653 | 8/1983 | Japan . |
| 59-167051 | 9/1984 | Japan . |
| 2191893 | 12/1987 | United Kingdom . |

OTHER PUBLICATIONS

Iizuka, et al., "Variable resistance polysilicon for high density CMOS Ram," Semiconductor Device Engineering Laboratory, Toshiba Corporation, p. 370–373, Dec. 1984.
Garnache, "Complimentary FET memory cell," IBM Technical Disclosure Bulletin, vol. 18, No. 12, p. 3947 (1976), May 1976.

(List continued on next page.)

*Primary Examiner*—Olik Chaudhuri
*Assistant Examiner*—Howard Weiss
*Attorney, Agent, or Firm*—Theodore E. Galanthay; Lisa K. Jorgenson; Andre Szuwalski

[57] ABSTRACT

A six transistor static random access memory (SRAM) cell with thin-film pull-up transistors and method of making the same includes providing two bulk silicon pull-down transistors of a first conductivity type, two active gated pull-up thin-film transistors (TFTs) of a second conductivity type, two pass gates, a common word line, and two bit line contacts. The bulk silicon pull-down transistors, two active gated pull-up TFTs, and two pass gates are connected at four shared contacts. In addition, the two bulk silicon pull-down transistors and the two active gated pull-up TFTs are formed with two polysilicon layers, a first of the polysilicon layers (poly1) is salicided and includes poly1 gate electrodes for the two bulk silicon pull-down transistors. A second of the polysilicon layers (poly2) includes desired poly2 stringers disposed along side edges of the poly1 gate electrodes, the desired poly2 stringers forming respective channel regions of the pull-up TFTs.

18 Claims, 5 Drawing Sheets

U.S. PATENT DOCUMENTS

| | | | |
|---|---|---|---|
| 4,467,518 | 8/1984 | Bansal et al. | 29/571 |
| 4,476,475 | 10/1984 | Naem et al. | 357/23.7 |
| 4,502,202 | 3/1985 | Malhi | 29/571 |
| 4,505,026 | 3/1985 | Bohr et al. | 437/193 |
| 4,545,112 | 10/1985 | Holmberg et al. | 29/577 |
| 4,554,572 | 11/1985 | Chatterjee | 357/42 |
| 4,554,729 | 11/1985 | Tanimura et al. | 29/571 |
| 4,556,895 | 12/1985 | Ohata | 357/23.7 |
| 4,560,419 | 12/1985 | Bourassa et al. | 437/46 |
| 4,561,907 | 12/1985 | Raicu | 437/46 |
| 4,581,623 | 4/1986 | Wang | 357/23.7 |
| 4,593,453 | 6/1986 | Tam et al. | 357/59 E |
| 4,597,160 | 7/1986 | Ipri | 29/571 |
| 4,603,468 | 8/1986 | Lam | 29/571 |
| 4,619,037 | 10/1986 | Taguchi et al. | 437/195 |
| 4,628,589 | 12/1986 | Sundaresan | 29/571 |
| 4,633,438 | 12/1986 | Kume et al. | 365/51 |
| 4,654,121 | 3/1987 | Miller et al. | 156/653 |
| 4,772,927 | 9/1988 | Saito et al. | 357/23.7 |
| 4,789,644 | 12/1988 | Meda | 437/41 |
| 4,797,804 | 1/1989 | Rockett, Jr. | 365/154 |
| 4,805,147 | 2/1989 | Yamanaka et al. | 365/154 |
| 4,814,850 | 3/1989 | Malhi | 357/42 |
| 4,841,481 | 6/1989 | Ikeda et al. | 257/903 |
| 4,877,483 | 10/1989 | Bergemont et al. | 437/191 |
| 4,890,148 | 12/1989 | Ikeda et al. | 357/45 |
| 4,916,665 | 4/1990 | Atsumi et al. | 365/185 |
| 4,918,510 | 4/1990 | Pfiester | 357/42 |
| 4,920,391 | 4/1990 | Uchida | 357/23.6 |
| 4,921,813 | 5/1990 | Madan | 437/46 |
| 4,950,620 | 8/1990 | Harrington, III | 437/60 |
| 4,966,864 | 10/1990 | Pfiester | 437/191 |
| 4,980,732 | 12/1990 | Okazawa | 357/23.5 |
| 4,987,092 | 1/1991 | Kobayashi et al. | 437/57 |
| 4,990,998 | 2/1991 | Koike et al. | 357/71 |
| 5,001,539 | 3/1991 | Inoue et al. | 357/41 |
| 5,001,540 | 3/1991 | Ishihara | 357/23.4 |
| 5,057,898 | 10/1991 | Adan et al. | 357/59 |
| 5,083,190 | 1/1992 | Pfiester | 357/42 |
| 5,135,888 | 8/1992 | Chan et al. . | |
| 5,151,376 | 9/1992 | Spinner, III | 437/60 |
| 5,157,474 | 10/1992 | Ochii | 357/41 |
| 5,159,416 | 10/1992 | Kudoh | 357/23.7 |
| 5,162,892 | 11/1992 | Hayashi et al. | 257/65 |
| 5,173,754 | 12/1992 | Manning | 257/69 |
| 5,187,114 | 2/1993 | Chan et al. | 437/60 |
| 5,192,704 | 3/1993 | McDavid et al. . | |
| 5,196,233 | 3/1993 | Chan et al. . | |
| 5,248,630 | 9/1993 | Serikawa et al. | 437/101 |
| 5,262,655 | 11/1993 | Ashida | 257/66 |
| 5,283,455 | 2/1994 | Inoue et al. | 257/329 |
| 5,298,782 | 3/1994 | Sundaresan | 257/393 |
| 5,349,206 | 9/1994 | Kimura | 257/69 |
| 5,373,170 | 12/1994 | Pfiester et al. | 257/69 |
| 5,388,067 | 2/1995 | Sato et al. | 365/154 |
| 5,451,534 | 9/1995 | Yang . | |
| 5,591,653 | 1/1997 | Sameshima et al. | 437/40 |
| 5,770,892 | 6/1998 | Chan et al. . | |
| 5,801,396 | 9/1998 | Chan et al. . | |
| 5,821,136 | 10/1998 | Chan et al. . | |
| 5,866,921 | 2/1999 | Kim | 257/67 |

OTHER PUBLICATIONS

Lim, et al., Threshold voltage of thin–film silicon–on–insulator (SOI) MOSFETs, IEEE Transactions on Electron Devices, vol. ED–30, No. 10, p. 1244 (1983). Oct. 1983.

Yamanaka, et al., "A 25 um2, new poly–Si PMOS load (PPL) SRAM cell having excellent soft error immunity," IEDM, p. 48 (1988), Dec. 1988.

Weimer, "The TFT–a new thin–film transistor," Proceedings of the IRE, p. 1462 (1962), Jun. 1962.

Unagami, et al., "High–voltage polycrystalline–silicon TFT for addressing electroluminescent devices," Proceedings of the SID, vol. 25/2, p. 117 (1984), Dec. 1984.

Malhi, et al., "p–Channel MOSFETs in LPCVD polysilicon," IEEE Electron Device Letters, vol. EDL–4, No. 10, p. 369 (1983), Oct. 1983.

Shiehijo, et al., "Polysilicon transistors in VLSI MOS memories," IEDM, p. 228 (1984), Dec. 1984.

Sundaresan, et al., "A fully self–aligned stacked CMOS 64K SRAM," IEDM, p. 871 (1984), Dec. 1984.

Colinge, et al., "Stacked transistors CMOS (ST–MOS), an NMOS technology modified to CMOS," IEEE Transactions on Electron Devices, vol. ED–29, No. 4, p. 585 (1982), Apr. 1982.

Gibbons, et al., "One–gate wide CMOS inverter on laser–recrystallized polysilicon," IEEE Electron Device Letters, vol. EDL–1, No. 6, p. 117 (1980). Jun. 1980.

Seki, et al., "Laser–recrystallized polysilicon thin–film transistors with low leakage current and high switching ratio," IEEE Electron Device Letters, vol. EDL–8, No. 9, p. 425 (1987).

Wolf, Stanley "Silicon process for the VLSI Era vol. 2: Processing integration," Lattice Press, pp. 507–510, 1990.

Colinge, et al., "A high density CMOS inverter with stacked transistors," IEEE Electron Device Letters, vol. EDL–2, No. 10, p. 250 (1981), Oct. 1981.

Kamins, et al., "Hydrogenation of transistors fabricated in polycrystalline–silicon films," IEEE Electron Device Letters, vol. EDL–1, No. 8, p. 159 (1980), Aug. 1980.

Malhi, et al., "Characteristics and three–dimensional integration of MOSFETs in small grain LPCVD polycrystalline silicon," IEEE Journal of Solid–State Circuits, vol. SC–20, No. 1, p. 178 (1985).

Caymax, et al., "Low temperature selective growth of epitaxial Si and Si1–xGex layers from SiH4 and GeH4 in an ultrahigh vacuum, very low pressure chemical vapor deposition reactor: kinetics and possibilities," Thin Solid Films, p. 324 (1994), Dec., 1994.

Johnson, et al., "Selective chemical etching of polycrystalline SiGe alloys with respect to Si and Si02," Journal of Electronic Materials, vol. 21, No. 8 (1992), Dec., 1992.

Lin, et al.,"Effects of SiH4, GeH4, and B2H6 on the nucleation and deposition of polycrystalline Si1–xGex films," J. Electrochem. Soc., vol. 141, No. 9 (1994), Sep., 1994.

King, et al., "Deposition and properties of low–pressure chemical–vapor deposited polycrystalline silicon–germanium films," J. Electrochem. Soc., vol. 141, No. 9 (1994), Aug., 1994.

Prokes, Formation of epitaxial Si1–xGex films produced by wet oxidation of amorphous SiGe layers deposition on Si(100). Appl. Phys. Lett., vol. 53, p. 2483 (1988), Dec., 1988.

Tsutsu, "Oxidation of polycrystalline–SiGe alloys," Appl. Phys. Lett, vol. 64, No. 3, p. 297 (1994), Dec., 1994.

Lin, et al., "Fabrication of p–channel polycrystalline Si1–xGex thin film transistors by ultrahigh chemical vapor deposition," Appl. Phys. Lett. p. 1700 (1994), Sep., 1994.

Humlicek, et al., "Optical spectra of SixGe1–x alloys," J. Appl. Phys., vol. 65, p. 2827 (1989), Apr., 1989.

Selvakumar, "SiGe–channel n–MOSFET by germanium implantation," IEEE Electron Device Letters, vol. 12, No. 8 (1991), Aug., 1991.

King, et al., "PMOS transistors in LPCVD polycrystalline silicon–germanium films," IEEE Electron Device Letters, vol. 12, No. 11, p. 584 (1991), Nov., 1991.

Verdonckt–Vandebroek, et al., "High–mobility modulation–doped graded SiGe–channel p–MOSFETs," IEEE Electron Device Letters, vol. 12, No. 8 (1991), Aug., 1991.

Cao, et al., "Low pressure chemical vapor deposition of Si1–x–Gex films on Si02," J. Electrochem. Soc., vol. 142, No. 5 (1995).

King, et al., "Polycrystalline silicon–germanium thin–film transistors," IEEE Transactions on Electron Devices, vol. 41, No. 9 (1994), Sep., 1994.

Verdonckt–Vandebroek et al., "SiGe–channel heterojunction p–MOSFETs," IEEE Transactions on Electron Devices, vol. 41, No. 1 (1994), Jan., 1994.

King, "Electrical properties of heavily doped polycrystalline silicon–germanium films," IEEE Transactions on Electron Devices, vol. 41, No. 2 (1994), Feb., 1994.

Taur, et al., "0.1 pm CMOS and beyond," International Symposium on VISI Technology, Systems and Applications, VLSITSA (1993), Dec., 1993.

Verdonckt–Vandebroek, et al., "Design issues for SiGe heterojunction FETs," Proceeding IEEE/Cornell Conference on Advanced Concepts in High Speed Semiconductor Devices and Circuits, p. 425 (1991), Aug., 1991.

King, "A low–temperature (<or=550C) silicon–germanium MOS thin–film transistor technology for large–area electronics," IEDM, p. 567 (1991), Dec., 1991.

Kesan, et al., "High performance 0.25 pm p–MOSFETs with silicon–germanium channels for 300k and 77k operation," IEDM, p. 25 (1991), Dec., 1991.

Hamakawa, "Recent advances in amorphous silicon solar cells and their technologies," Journal of Non–Crystalline Solids, vol. 59 & 60, p. 1265 (1983).

European Search Report, Oct. 5, 1998, European Patent Application No. 98304874.5.

Hsieh, et al., "Ambipolar Performances of Novel Amorphous Silicon–Germanium Alloy Thin–Film Transistors", Jpn. J. Appl. Phys., vol. 32 (1993) pp. L 1043–L 1045.

Noguchi, et al., "Resistivity Study of P–, B–, and $BF_2$–Implanted Polycrystalline $Si_{1-x}Ge_x$ Films with Subsequent Annealing", Jpn. J. Appl. Phys., vol. 33 (1994) pp. L 1748–L 1750.

SRAM CELL STRUCTURE WITH DIELECTRIC SIDEWALL SPACERS AND DRAIN AND CHANNEL REGIONS DEFINED ALONG SIDEWALL SPACERS

BACKGROUND OF THE INVENTION

1. Field of the Invention

The present invention relates to semiconductor integrated circuit structures and methods of making such structures and, more particularly, to a method of making and structure of SRAM cells.

2. Discussion of the Related Art

CMOS static random access memories (SRAM) are used in the semiconductor and computer industries as a result of the combination of speed, low power, and no requirement for refresh. Information can be written into and read out of an SRAM cell faster than with a DRAM cell, because the transistors of the SRAM cell can be switched faster than capacitors can be charged and drained. However, a disadvantage of prior art SRAM cells is that such cells have required a larger footprint to achieve greater speed and stability than DRAM cells.

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory (DRAM) or static-random-access-memory (SRAM), the components must be arranged compactly if the overall device dimensions are not to become excessively large. This problem is especially critical in SRAM devices where a typical individual memory cell contains as many as six separate components.

One technique to reduce SRAM memory cell dimensions is to split the wordline over the cell. The wordline controls read and write functions to the cell by turning the access transistors on and off. By splitting the wordline into two separate lines, a more symmetrical cell layout is possible. However, even with a split wordline memory cell design, a need remains to further reduce the overall cell dimensions. Although split wordline designs reduce the area of the cell, fundamental manufacturing limitations remain. Active surface regions of the cell must be made available for the interconnection leads providing supply and ground voltages to the cell. In addition, active surface area must be available for the formation of transistors providing read and write functions for the cell. However, downsizing of components can only be pursued to the limit of the line-width definition capability of the manufacturing process.

Another technique for fabricating a memory cell having a small surface area is to stack MOS transistors in a vertical arrangement. Typically, a driver transistor is formed in the substrate having source, drain, and channel regions in the substrate and a gate electrode overlaying the substrate surface. Then, a load transistor is formed in a thin-film layer overlying the first transistor. By adding an additional electrical component to the device, the thin-film transistor increases the functional capacity of a device while not consuming additional surface area, or requiring further downsizing of components.

While stacking transistors in a vertical arrangement can reduce the surface area of a memory cell, valuable surface area must still be allocated for coupling electrical signals to the memory cell. The electrical signals are typically introduced by metal leads overlying the cell. As the overall area dimensions of the cell decrease, the metal leads carrying electrical signals to and from the cell must be brought closer together. Constructing a cell with stacked transistors can aggravate this problem because elaborate contact interconnection schemes are typically required in a stacked transistor memory cell. Therefore, new cell designs and process methodology must be employed if further reduction in memory cell area is to be achieved while avoiding performance degradation of the memory cell.

The basic SRAM cell can be formed using cross-coupled CMOS inverters having two N channel transistors and two P channel transistors. Typically, the cell is accessed by two N channel control gates for a standard SRAM cell and four control gates for two port memory devices. To conserve physical layout space, the P-channel transistors are often replaced with resistive loads.

Use of the P-channel transistors as the load for the SRAM cell, however, results in the cell having better electrical characteristics. Such cells are faster than those using resistive loads, since the P-channel transistors provide a higher drive current than high resistance devices. Also, use of P-channel transistors gives higher immunity to soft errors, such as those caused by alpha particle impacts and noise. The primary disadvantage of SRAM cells incorporating P-channel load transistors is that the layout area for each cell is significantly larger than those using resistive loads. This reduces device density and increases chip costs.

A disadvantage of using polycrystalline P-channel load transistors arises where ohmic contact is required between the interconnection of P-channel and N-channel transistors. Ohmic contact between interconnect layers is desirable because no P-N junction is formed. A P-N junction is formed, however, where polycrystalline interconnect lines having different conductivity types make contact. A similar junction can be formed when polycrystalline silicon lines having the same conductivity type, but very different doping levels (such as N− to N+) make contact.

The P channel MOSFET device provides a low OFF current and a high ON current to sustain leakage of the storage node. However, if the pulldown transistors exhibit high leakage, the Vcc must be electrically disconnected to reduce the standby current. Additionally, for the P channel device, the cell area is much larger than for the other devices described above. Such a cell and the method of making same are taught in U.S. Pat. No. 5,187,114.

There is thus a need for new SRAM cell design and process methodology if further reduction in memory cell area is to be achieved while avoiding performance degradation of the memory cell.

SUMMARY OF THE INVENTION

Accordingly, an SRAM cell includes a pair of N channel transistors acting as inverting circuits, a pair of N channel transistors which perform the control function for the cell, and a pair of P channel thin-film pull-up transistors.

A six transistor static random access memory (SRAM) cell with thin-film pull-up transistors and method of making the same includes providing two bulk silicon pull-down transistors of a first conductivity type, two active gated pull-up thin-film transistors (TFTs) of a second conductivity type, two pass gates, a common word line, and two bit line contacts. The bulk silicon pull-down transistors, two active gated pull-up TFTs, and two pass gates are connected at four shared contacts. In addition, the two bulk silicon pull-down transistors and the two active gated pull-up TFTs are formed with two polysilicon layers, a first of the polysilicon layers (poly1) is salicided and includes poly1 gate electrodes for the two bulk silicon pull-down transistors. A second of the polysilicon layers (poly2) includes desired poly2 stringers disposed along side edges of the poly1 gate electrodes, the desired poly2 stringers forming respective channel regions of the pull-up TFTs.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings. It will be appreciated that for simplicity and clarity of illustration, elements shown in the drawings have not necessarily been drawn to scale. For example, the dimensions of some of the elements are exaggerated relative to each other for clarity. Like reference numerals are used to identify like parts in the various views and in which.

DETAILED DESCRIPTION OF A PREFERRED EMBODIMENT OF THE INVENTION

The process steps and structures described herein do not form a complete process flow for manufacturing integrated circuits. The present invention can be practiced in conjunction with integrated circuit fabrication techniques currently used in the prior art, and only so much of the commonly practiced process steps are included as are necessary for an understanding of the present invention. The figures representing portions of an integrated circuit during fabrication are not drawn to scale but instead are drawn so as to illustrate the important features of the invention.

Figure 1:
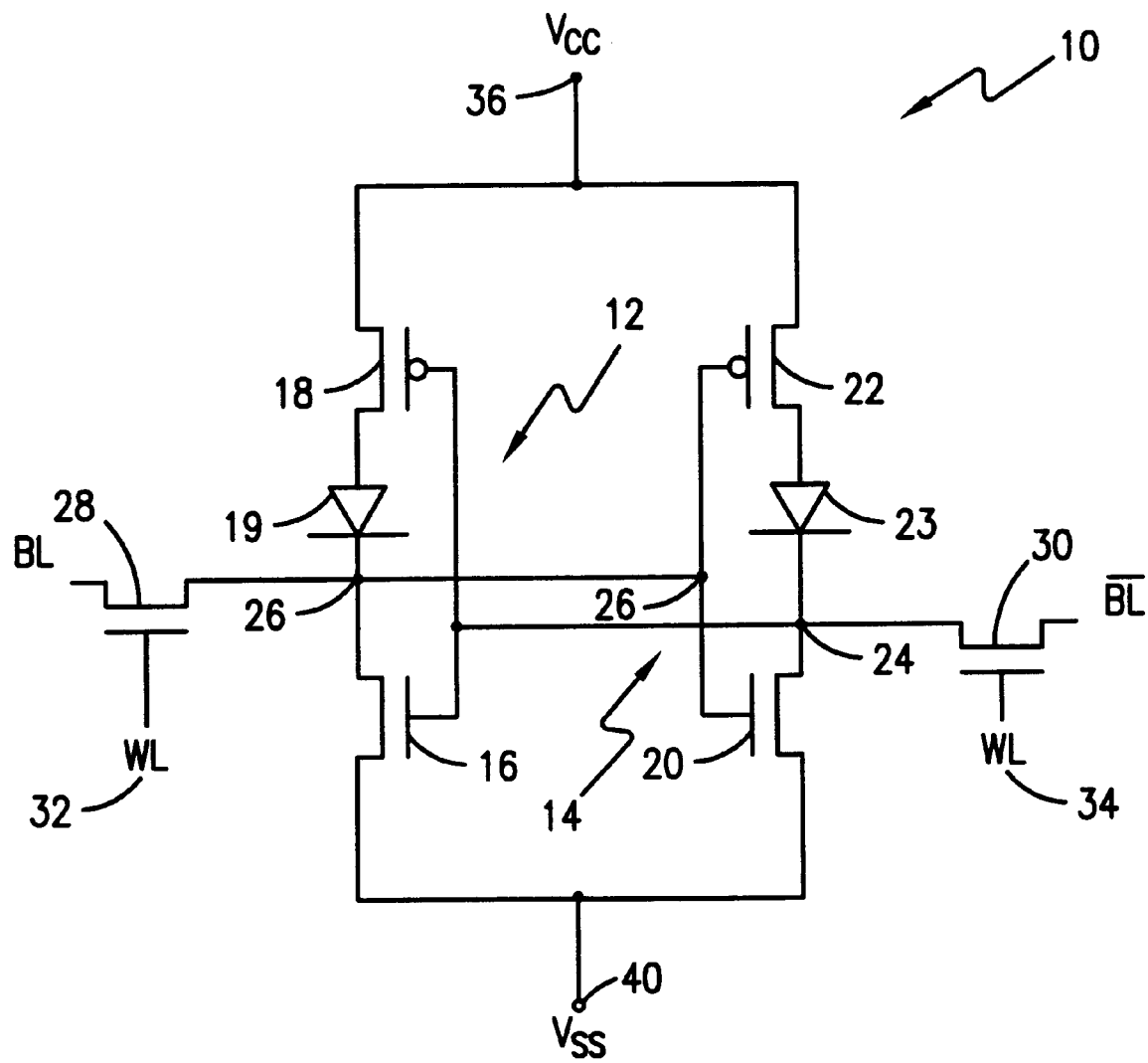
FIG. 1 illustrates a circuit diagram of a six transistor SRAM memory cell in accordance with the present invention.

Referring now to FIG. 1, a schematic circuit diagram of an SRAM cell 10 according to the present invention is shown. Memory cell 10 is further illustrated in an MOS integrated circuit layout in accordance with the invention in FIG. 2. Memory cell 10 includes two cross-coupled, CMOS inverters 12 and 14. CMOS inverter 12 includes an NMOS driver transistor 16 and a PMOS thin-film, load transistor 18 fabricated in accordance with the present invention as further described herein below. A junction diode 19 is formed at a location where a drain region of PMOS thin-film load transistor contacts a drain region of NMOS driver transistor 16. Similarly, CMOS inverter 14 includes an NMOS driver transistor 20 and a PMOS thin-film, load transistor 22 fabricated in accordance with the present invention as further described herein below. A junction diode 23 is formed at a location where a drain region of PMOS thin-film load transistor contacts a drain region of NMOS driver transistor 20. The input of CMOS inverter 12 is coupled to the output of inverter 14 by a shared contact formed at node 24, and the input of CMOS inverter 14 is coupled to the output of inverter 12 by a shared contact formed at node 26. Pass transistors 28 and 30 are controlled by word lines (WL) 32 and 34, respectively. Pass transistors 28 and 30 are also coupled to the outputs of inverters 12 and 14 at nodes 26 and 24, respectively. Pass transistors 28 and 30 provide bit-line access BL and $\overline{BL}$, respectively, to memory cell 10. As further illustrated in FIG. 1, a Vcc power supply signal is provided to CMOS inverters 12 and 14 at node 36. A Vss ground signal is provided to CMOS inverters 12 and 14 at node 40.

In an alternative embodiment, the drain region of the NMOS driver transistors 16 and 20 are salicided, thus eliminating the formation of junction diodes 19 and 23. The salicided drain regions of the NMOS driver transistors 16 and 20 form ohmic contacts with respective drain regions of PMOS thin-film, load transistors 18 and 22, respectively, when the drain regions of the NMOS driver transistors 16 and 20 are salicided.

Figure 2:
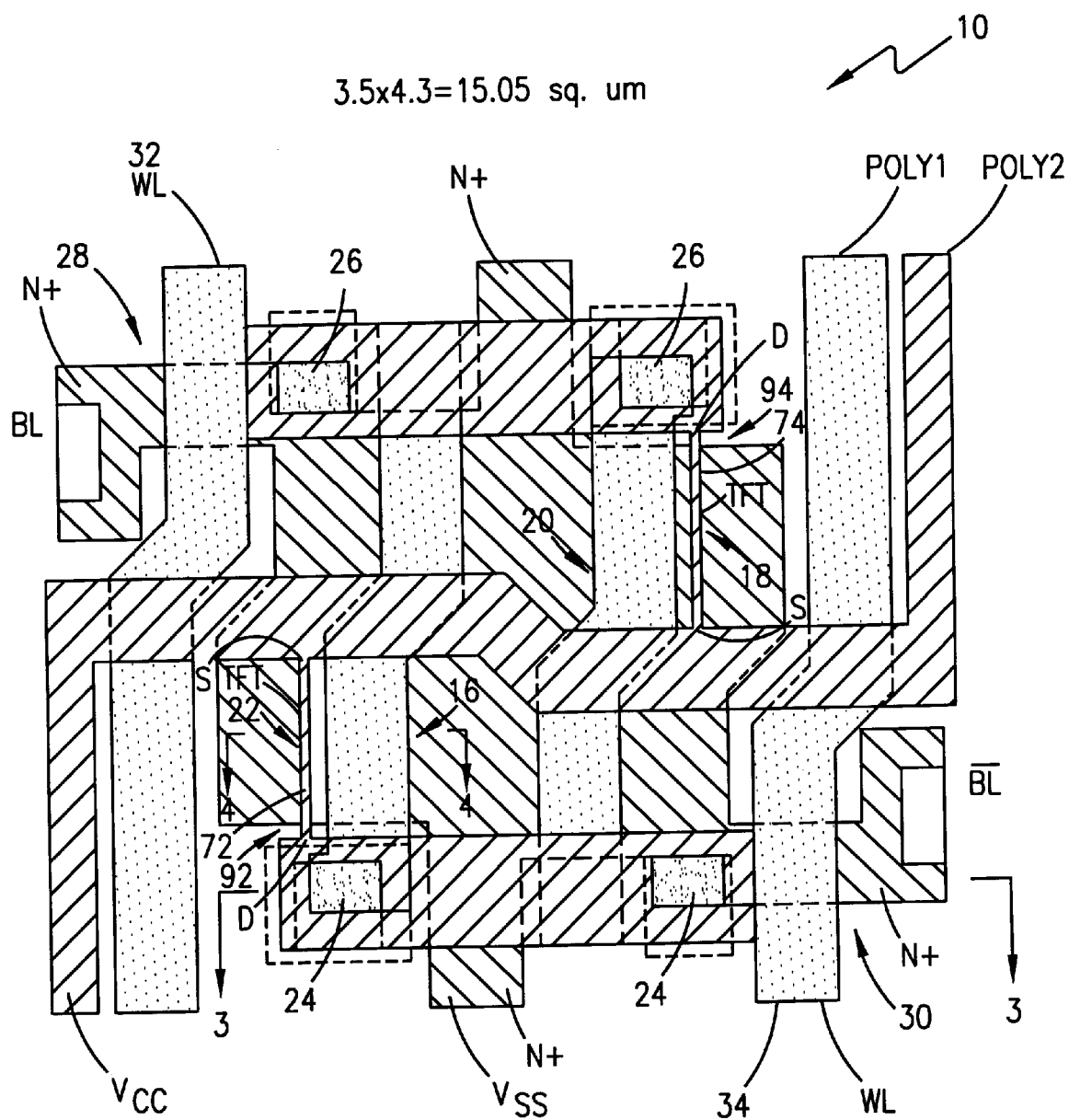
FIG. 2 illustrates a layout for an SRAM cell in accordance with the present invention.
Figure 3:
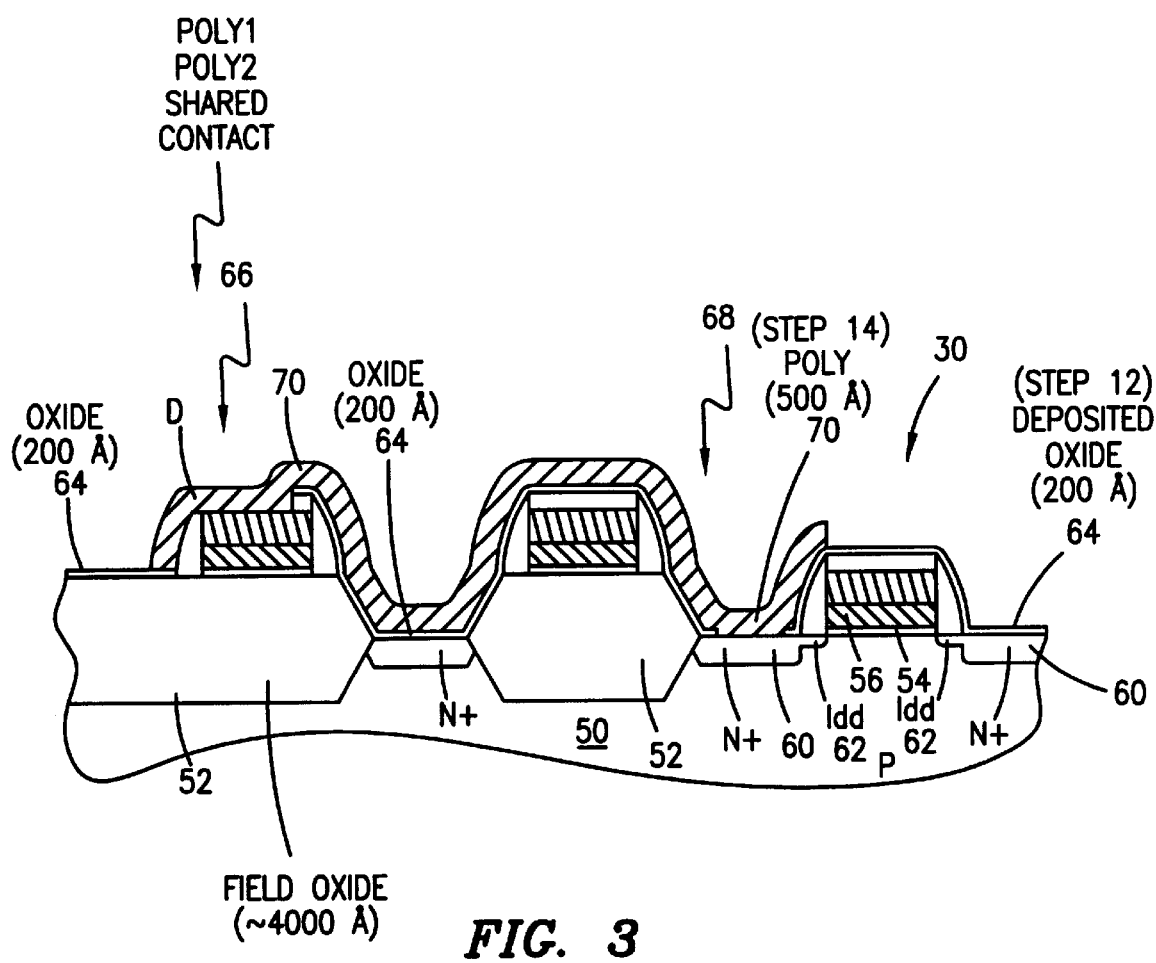
FIG. 3 illustrates, in cross-section, one of the process steps in accordance with the present invention and illustrating a portion of the memory cell of FIG. 2 taken along section line 3—3.
Figure 4:
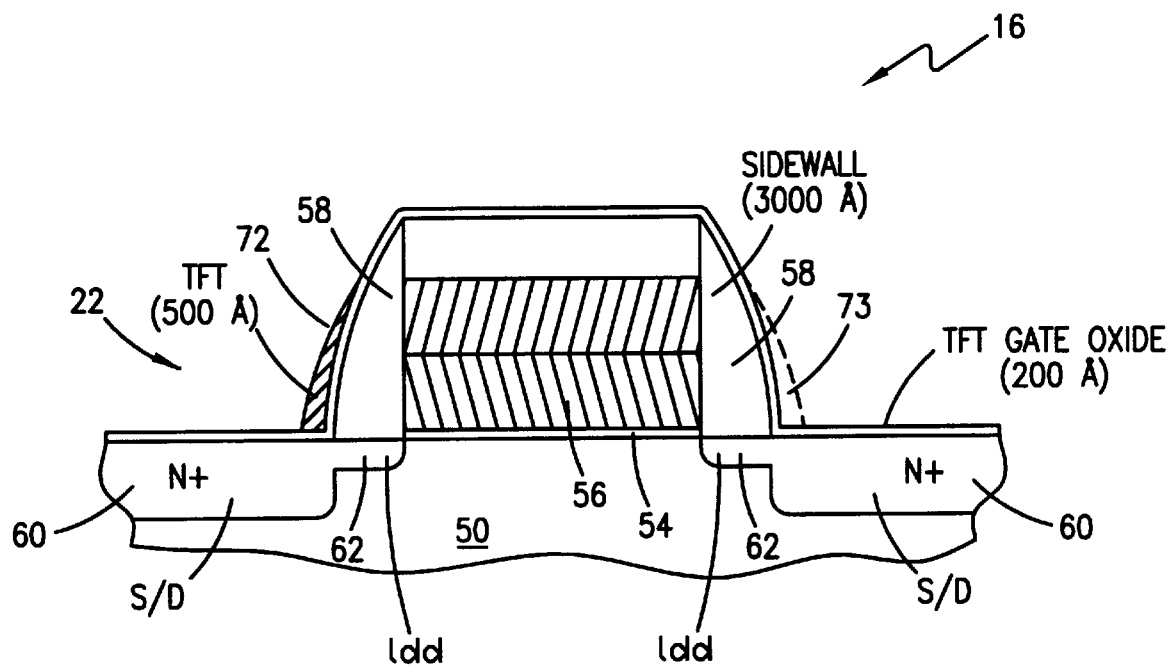
FIG. 4 illustrates, in cross-section, a portion of the memory cell illustrated in FIG. 2 taken along section line 4—4 at an intermediate stage of the process in accordance with the present invention.

Turning to FIG. 2, the physical structure and the method of constructing an SRAM cell in accordance with the present invention will be described. Shown in FIG. 2, is a top view of memory cell 10 illustrating the locations of nodes and transistors noted in the circuit diagram of FIG. 1. The relationship of the various components of memory cell 10 can be better understood following a description of the process steps used in the fabrication of SRAM cell 10. Accordingly, the fabrication of memory cell 10 is illustrated using FIG. 3 and FIG. 4, wherein FIG. 3 illustrates, in cross-section, a portion of memory cell 10 taken along line 3—3 of FIG. 2. FIG. 4 illustrates, in cross-section, a portion of memory cell 10 taken along line 4—4 of FIG. 2. Those skilled in the art will recognize that memory cell 10 in inversely symmetrical with respect to structures formed in the active region, and although only structures formed in a first part of the active region are depicted in FIG. 3, corresponding structures are formed, concurrently, in the second part of the active region. Similarly, corresponding structures are formed concurrently on an opposite side of memory cell 10 from section line 4—4.

Referring now to FIGS. 2–4, an integrated circuit device 10 is formed beginning with silicon substrate having a p-well portion 50 and an n-well portion (not shown). The cross-section shown in FIG. 3 includes N-channel transistor 30, while the cross-section shown in FIG. 4 includes N-channel transistor 16 and the channel region of p-channel thin-film transistor 22. The discussion to follow is directed to N-channel transistors 30 and 16 and TFT 22 shown in FIGS. 3 and 4; however, the discussion applies similarly for N-channel transistors 28 and 20 and TFT 18, respectively.

Selected regions of the substrate 50 are oxidized to form field oxide insulating regions 52. Field oxide insulating regions 52 have a thickness, for example, on the order of 4,000 Å (angstroms). N-channel field effect devices 16, 20, 28 and 30, each include a gate oxide 54, a gate electrode 56, sidewall oxide spacers 58 and source/drain regions 60.

The gate oxide, gate electrode, sidewall oxide spacers and source/drain regions are manufactured by methods known in the art. More particularly, gate oxide 54 and gate electrode 56 are part of a gate electrode stack. The gate electrode stack shall be referred to herein as a first polycrystalline gate electrode stack (Poly1 gate stack). The Poly1 gate stack is formed by patterning and etching a stack of layers including a gate oxide, a first polycrystalline silicon (polysilicon), a salicide, and an oxide. The first polysilicon includes polysilicon that is typically used to form gate electrodes for field effect devices.

Subsequent to the patterning and etching of the poly1 gate stack, lightly doped drain (ldd) regions 62, sidewall oxide spacers 58, and source/drain regions 60 are formed for the N-channel transistors 16 and 20 by methods known in the art. N-type ions are implanted in regions of the semiconductor substrate not covered by gate oxide 54 to form the ldd regions 62. An oxide layer is then formed over the integrated circuit by known methods, patterned and etched to expose a portion of the underlying conductive structure source/drain regions 60 of devices 16 and 30. A portion of the gate electrode 56 may also be exposed during the patterning and etching steps. Source/drain regions 60 and gate electrode 56 of the N-channel field effect transistor devices 16 and 30 are typically implanted with an N+ type dopant such as arsenic or phosphorus.

Device fabrication up to this stage utilizes conventional process steps well known in the art. Historically, the SRAM cell is built with all N-channel and P-channel field effect devices or transistors being formed in the substrate. In order to increase packing density while maintaining better electrical characteristics using P-channel transistors as load devices, a first polysilicon layer is used in the fabrication of the N-channel drive transistors 20 and 16, while a second polysilicon layer is used in the fabrication of the TFTs 18 and 22. The P-channel transistors of the SRAM cell according to the present invention include thin-film transistors 18 and 22 having a respective stringer channel region (alternatively referred to as a stick channel region) running along side a gate electrode of N-channel drive transistors 20 and 16, respectively. TFTs 18 and 22 utilize a source/drain region 60 underlying a respective stringer channel region as a gate electrode of the corresponding TFT. As a result, an SRAM cell in accordance with the present invention can be fabricated using 0.5 μm design rules to have a cell size in the range of 10 to 20 μm². Alternatively, using 0.35 μm design rules, a cell size in the range of 10 to 15 μm² is possible.

An oxide insulating layer 64 of a thickness on the order of 200 Å is formed over the integrated circuit by known methods. A portion of oxide insulating layer 64 shall become a gate oxide for TFT 22, as shown in FIG. 4. Oxide layer 64 is patterned and etched in regions which will become strapped contact regions (i.e., shared contact regions), such as regions 66 and 68 of FIG. 3.

A second polycrystaline silicon layer 70 (hereafter referred to as poly2) is then formed over the integrated circuit. The poly2 layer has a thickness in the range of 400 to 600 Å, preferably on the order of 500 Å. The poly2 layer 70 is used for providing an active area to poly1 interconnect strap (i.e. a poly1/poly2 shared contact), connection to Vcc, and for use as the respective p-channel regions 72 and 74 of the pull-up transistors 18 and 22.

The poly2 layer 70 is typically a doped polysilicon layer. Poly2 is doped in the following manner. A first implant with an n-type dopant such as arsenic or phosphorous is conducted for adjusting a threshold voltage Vt of the p-channel of the thin film pull-up transistors to a desired level. Next, poly2 layer 70 is masked or patterned for Vcc, source/drain implant and strapped contact areas of the poly2.

Patterning of the poly2 layer 70 is followed by an ion implant of the Vcc, source/drain and strapped contact areas of poly2 using a P+ type dopant such as boron or boron biflouride (BF$_2$). This heavily doped implant is also for the P+ source and drain regions of the thin film p-channel pull-up transistors 18 and 22. Thus, the P+ implant must extend close to the active/gated area 72 and 74 of the thin-film p-channel pull-up transistors 18 and 22 to form a respective source region S. The drain D of the thin-film p-channel pull-up transistors 18 and 22 may be offset negatively to reduce subthreshold leakage (i.e., current leakage). The gate electrode of each of the thin-film p-channel pull-up transistors 18 and 22 are formed by the substrate storage node side of the n-channel pull-down transistors 20 and 16, respectively. In other words, the gate electrode of each TFT 18 and 22 is the substrate storage node side of the respective n-channel pull-down transistor 20 and 16, respectively.

Following the P+ implant, the poly2 layer 70 is patterned and etched to create the strapped contacts and the Vcc trace, utilizing an appropriate selective etch or isotropic etch. During this step of patterning and etching to create the strapped contacts and Vcc trace, poly2 stringers (i.e., sticks) are created which remain along edges of the poly1 patterned layer. For example, as shown in FIG. 4, two cross-sections of such poly2 stringers are illustrated and identified by reference numerals 72 and 73. Stringers 72 and 73 have a width dimension on the order of 500 Å. Poly2 stringer 72 will become the p-channel region of thin-film transistor 22 and poly2 stringer 73 (shown in phantom lines) is to be removed. Similarly, poly2 stringer 74 will become the p-channel region of TFT 18 (FIG. 2). Except for the poly2 stringers 72 and 74, all other poly2 stringers (i.e. stringer 73 and others not shown) are removed as follows. A stringer removal mask is appropriately patterned upon the integrated circuit, wherein the desired poly2 stringers 72 and 74 are masked (i.e., protected). The integrated circuit is then subjected to an appropriate etch for removing the undesired stringers (i.e., remove the "weed" stringers).

A dielectric layer is then deposited upon the integrated circuit. Fabrication of SRAM 10 then continues according to normal backend interconnect processing. That is, contact and metal interconnections are made to complete the circuit.

The present invention is thus drawn to a two poly, six transistor SRAM cell. The approximate cell size with typical 0.5 μm design rules is on the order of 10 to 20 μm² with 0.35 μm design rules, the approximate cell size is on the order of 10–15 μm².

Referring once again to FIG. 2, in addition to the above discussion, the drain areas of the thin-film pull up transistors 72 and 74 are each offset negatively to reduce a subthreshold leakage. The drain areas of each TFT are offset negatively from the underlying N+ gate electrode of the respective TFT, i.e., displaced, disposed away from, and non-overlapping as indicated by reference numerals 92 and 94 respectively. The non-overlapping arrangement of the TFT drain region D with respect to a corresponding gate region reduces a device current leakage of the TFT in the area of the drain P+ and gate electrode N+ regions.

Still further, with respect to FIG. 2, in accordance with the present invention, the SRAM cell 10 is tolerable of slight patterning misalignments as a result of its symmetrical layout. For example, a misalignment might include a slight shifting of poly1 up, down, left or right with respect to the active area. In addition, any misalignment of the poly1 horizontally with respect to the active area would have minimal effect, since the cell still looks the same vertically. Thus, with any slight misalignments, the transistor geometries remain the same and any misalignment would have minimal adverse effect. In other words, SRAM cell 10 would still be operational. The present invention is thus not subject to adverse operational degradation in view of slight misalignments between poly1 and the active area, wherein the dimensions of the bulk transistors remain the same. Similar reasoning applies with respect to the TFTs also.

Still further, the TFTs of the SRAM cell 10 according to the present invention include 500 Å width poly2 stringers, thus the TFTs operate at very low current, i.e, on the order of ten times (10×) lower than thin film transistors having 0.5 $\mu$m widths fabricated using conventional fabrication techniques. In other words, the cross-section of the p-channel stringers of the present invention are made on the order of ten times (10×) smaller compared with conventional thin film transistor techniques. The leakage current of the p-channel TFTs of the SRAM cell 10 is thus (10×) smaller. That is, the dc leakage current is proportional to the cross-section of the TFT channel, and thus the leakage current is at least (10×) smaller relative to a TFT fabricated using conventional techniques.

The process of making SRAM cell according to the present invention thus includes the steps of:

(a) forming an active well region in a semiconductor substrate;
(b) forming field isolation regions;
(c) forming a poly1 gate stack, the poly1 gate stack including a gate oxide, polysilicon, salicide, and an oxide;
(d) patterning and etching the poly1 gate stack;
(e) forming ldd regions, spacer and source/drain (s/d) regions;
(f) forming a gate oxide for thin-film pull up transistors;
(g) patterning and etching strapped contact regions;
(h) depositing a second polysilicon (poly2), wherein the poly2 is used for active to poly1 interconnect strap, Vcc, and for the p-channel of the thin-film pull up transistors;
(i) implanting ions for adjusting a threshold voltage Vt of the p-channel thin-film pull up transistors;
(j) patterning for Vcc/source-drain implant and strapped contact areas of the poly2;
(k) implanting ions for the Vcc/source-drain and strapped contacts using p-type dopant, wherein the implant is also a p+ implant for the pull up transistors and extends close to an active/gated source area of each pull up transistor, a drain area of the pull up transistors being offset negatively to reduce a subthreshold leakage, and a gate electrode of the pull up transistors is formed by a substrate storage node side of n-channel pull down transistors;
(l) patterning and etching second poly strapped contacts and a Vcc trace, wherein poly2 stringers are created along the poly1 edges;
(m) patterning a stringer removal mask for protecting desired poly2 stringers along side edges of the poly1 patterned layer;
(n) etching to remove undesired weed stringers; and
(o) depositing a dielectric material and continuing with backend interconnect processing.

Alternatively, the process for fabrication of memory cell 10 also includes the steps of:

1. forming P-well and N-well regions in a silicon substrate, the silicon substrate including an n-type substrate;
2. form field oxide isolation regions;
3. adjust threshold voltages Vtn and Vtp for bulk silicon N-channel and P-channel devices by ion implantations;
4. grow gate oxides on the order of 90 Å (angstroms);
5. deposit gate electrode stack layers including 1500 Å of poly 1, 1000 Å polycide (silicidated polysilicon), and 1500 Å oxide;
6. define and etch the oxide at polysilicon shared contact regions;
7. define and etch for gate layers (i.e., define and etch the gate electrode stacks as appropriate);
8. form LDD's (lightly doped drain regions) for bulk silicon transistors;
9. form oxide sidewall spacers;
10. form N+ s/d (source/drain) regions for bulk silicon N-channel devices and P+ s/d regions for bulk silicon P-channel devices;
11. salicide s/d regions using any suitable salicidation process known in the art;
12. deposit 200 Å gate oxide in desired regions for the thin-film load transistors (TFT);
13. define and etch for desired shared contact regions;
14. deposit 500 Å of a second polysilicon;
15. dope the channel for the P-channel TFT by ion implantation;
16. define and dope s/d for the P-channel TFT by ion implantation;
17. define and etch for TFT and Vcc trace, the Vcc trace acting as the source region of the P-channel TFT, wherein polysilicon stringers of the second polysilicon remain along edges of the first polysilicon patterned layer;
18. define and etch second poly silicon stringers other than those second polysilicon stringers intended for the TFT channels;
19. deposit undoped oxide, a doped oxide and then reflow; and
20. continue normal process steps for forming interconnections, etc.

In the above process, the N+ s/d regions for the N-channel devices is salicided. As indicated earlier herein, the salicided drain regions of the NMOS driver transistors form ohmic contacts with respective drain regions of the P-channel TFT. As a result, no junction diode is formed between the p-type second polysilicon and N+ drain region of a respective shared contact. In addition, the depositing of an undoped oxide, a doped oxide, followed by a reflow eliminates any cross-contamination in the channel regions of the p-channel TFTs.

Figure 5:
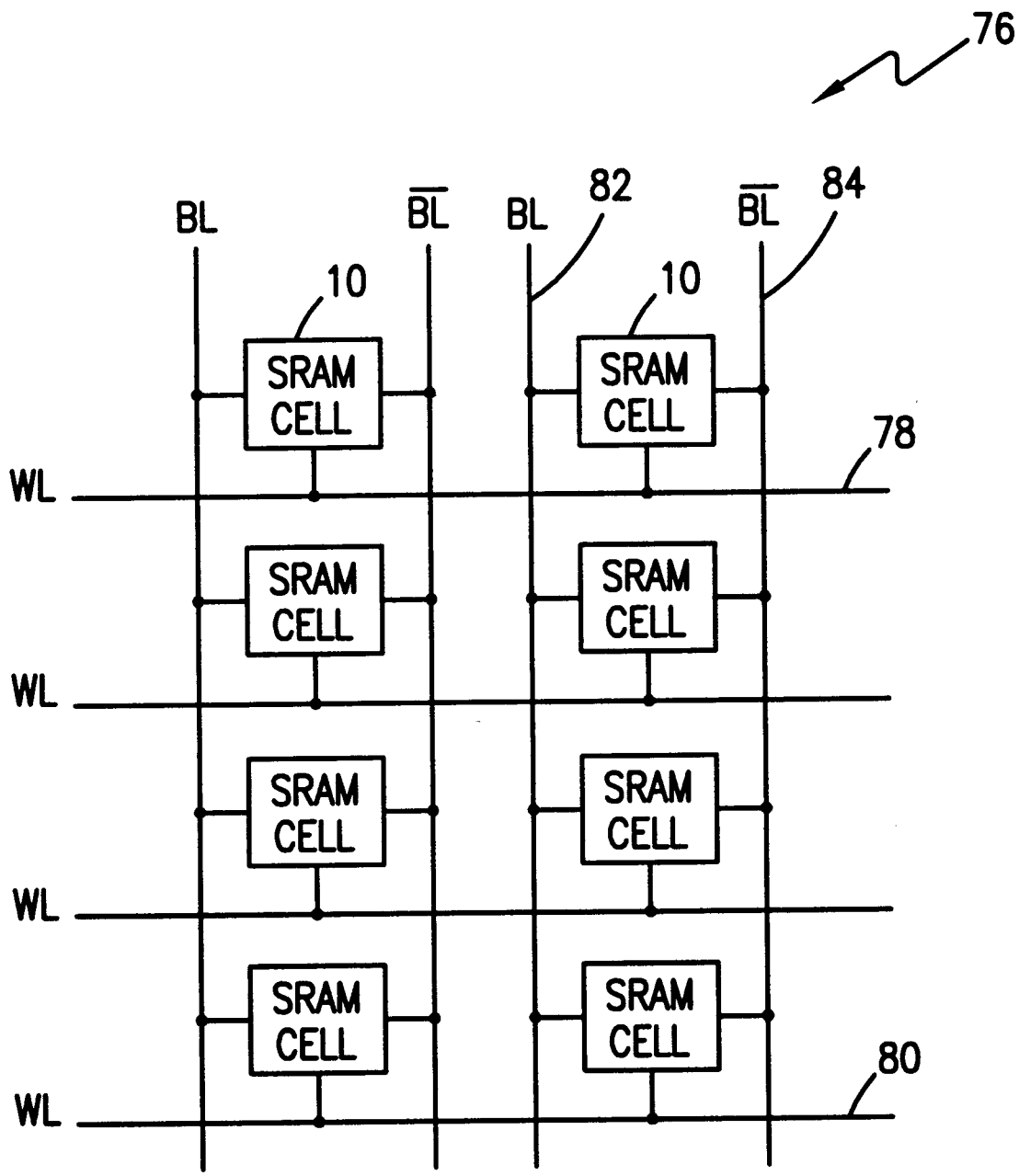
FIG. 5 illustrates an SRAM memory array including SRAM cells in accordance with the present invention.

Referring to FIG. 5, an SRAM cell array embodying the present invention will be described. Array 76 includes a number of cells 10 (see FIG. 2) arranged in rows and columns. Each cell is connected to a word line 78, . . . 80, and to a pair of bit lines 82, . . . 84.

In summary, the present invention of a six transistor SRAM cell 10 includes two polysilicon layers, the first poly silicon layer being salicided;
four shared contacts;
2 strapped contacts;
2 pass gates;
2 active gated pull up TFT transistors;
2 bulk silicon pull down transistors;
a common wordline; and
two bit lines wherein at a 0.5 $\mu$m design rule, the cell size is on the order of 10 to 20 $\mu m^2$. Using a 0.35 $\mu$m design rule, a cell size on the order of 10 to 15 $\mu m^2$ is possible.

There has thus been shown a method of making an SRAM cell method and an SRAM cell which advantageously provides a reduction in memory cell area while avoiding performance degradation of the memory cell. With such a method and apparatus of the present invention, a cell size on the order of 10 to 20 $\mu m^2$ is achievable.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit and scope of the present invention as limited solely by the appended claims.

What is claimed is:

1. A static random access memory (SRAM) semiconductor device structure, said structure comprising:

a semiconductor substrate having field isolation regions formed within an active well region of a first conductivity type;

a first transistor gate stack, the first transistor gate stack including a first gate oxide layer disposed over a first portion of the semiconductor substrate, and a first polysilicon layer disposed over the first gate oxide layer, the first transistor gate stack being patterned and etched wherein the first polysilicon layer forms a gate electrode for a first bulk pull-down transistor of a second conductivity type formed in the semiconductor substrate, and the first bulk pull-down transistor comprising a pull-down transistor of an SRAM cell;

dielectric sidewall spacers disposed about side edges of the first transistor gate stack and in contact therewith;

diffusion regions of the second conductivity type in the semiconductor substrate relative to the first transistor gate stack so as to form source and drain regions of the first bulk pull-down transistor;

a second gate oxide layer formed over the drain region of the first bulk pull-down transistor, the dielectric sidewall spacers and the first transistor gate stack; and a second polysilicon layer formed over the second gate oxide layer, in contact with the second gate oxide layer covering a side of one of the dielectric sidewall spacers and extending along a side of the first transistor gate stack, the second polysilicon layer, the drain region of the first bulk pull-down transistor and the second gate oxide layer forming a channel region, gate region and gate oxide, respectively, of a first thin-film pull-up transistor of the SRAM cell.

2. The SRAM semiconductor device structure according to claim 1, wherein:

the first conductivity type is a p-type, and the second conductivity type is an n-type.

3. The SRAM semiconductor device structure according to claim 1, wherein:

the drain diffusion region of the first bulk pull-down transistor is salicided and forms an ohmic contact with an interconnect segment of the second polysilicon layer.

4. The SRAM semiconductor device structure according to claim 1, further comprising:

a dielectric material disposed over the second polysilicon layer, said dielectric material includes a reflowed undoped oxide and a doped oxide.

5. The SRAM semiconductor device structure according to claim 1, wherein:

a drain area of the first thin-film pull-up transistor is offset relative to the gate region thereof.

6. A static random access memory (SRAM) cell, comprising:

a first bulk pull-down transistor of a first conductivity type;

a second bulk pull-down transistor of the first conductivity type;

a first pull-up thin-film transistor of a second conductivity type;

a second pull-up thin-film transistor of the second conductivity type;

said first bulk pull-down transistor and said first pull-up thin-film transistor forming a first inverter;

said second bulk pull-down transistor and said second pull-up thin-film transistor forming a second inverter which is cross-coupled to the first inverter; and two pass gates, each pass gate being connected to an output of one of said first and said second inverters;

wherein each said first and said second bulk pull-down transistors includes a gate formed by a first polysilicon layer over a semiconductor material and a drain diffusion region defined in the semiconductor material relative to the gate;

said first pull-up thin-film transistor having a gate oxide formed over said gate and said drain diffusion region of said second bulk pull-down transistor, a channel of a second polysilicon layer adjacent to a side of the gate of the second bulk pull-down transistor, and a gate comprising the drain diffusion region of the second bulk pull-down transistor;

said second pull-up thin-film transistor having a gate oxide formed over said gate and drain diffusion region of said first bulk pull-down transistor, a channel of the second polysilicon layer adjacent to a side of the gate of the first bulk pull-down transistor, and a gate comprising the drain diffusion region of the first bulk pull-down transistor;

said first and said second bulk pull-down transistors each includes dielectric sidewall spacers disposed along and in contact with lateral sides of said gate of said bulk pull-down transistor;

said gate oxide of said first and said second thin-film pull-up transistors being formed over said oxide spacers;

said channel of each said first and said second pull-up thin film transistor being defined along a dielectric sidewall spacer of said second and said first bulk pull-down transistor, respectively, and in contact with the gate oxide covering a side surface of said dielectric sidewall spacer.

7. The static random access memory cell according to claim 6, wherein:

the second conductivity type includes p-type, the second polysilicon layer includes a p+ implant in regions other than the channel of the first and second pull-up thin film transistors.

8. The static random access memory cell according to claim 6, wherein:

said first and second bulk pull-down transistors include salicided source/drain diffusion regions in the semiconductor substrate which form an ohmic contact with respective interconnect segments of the second polysilicon layer which electrically connect the first bulk pull-down transistor to the first thin-film pull-up transistor and electrically connect the second bulk pull-down transistor to the second thin-film pull-up transistor.

9. The static random access memory cell according to claim 6, further comprising:

a dielectric material disposed over the second polysilicon layer, said dielectric material includes a reflowed undoped oxide and a doped oxide.

10. The static random access memory cell according to claim 6, wherein:

a drain area of the thin-film pull up transistors is offset negatively relative to a gate region thereof.

11. The SRAM semiconductor device structure according to claim 8, wherein:

a first portion of the second polysilicon layer extending substantially along the dielectric sidewall spacer and the first transistor gate stack includes dopants of a first conductivity type, and second portions of the second polysilicon layer at either end of the first portion include dopants of a first conductivity type, the second portions forming source and drain regions of the first thin-film pull-up transistor.

12. The SRAM semiconductor device structure according to claim 1, wherein:

the second polysilicon layer which forms the channel region of the first thin-film pull-up transistor comprises a stringer.

13. The SRAM semiconductor device structure of claim 8, further including:

a second transistor gate stack, the second transistor gate stack including the first gate oxide layer disposed over a second portion of the semiconductor substrate, the first polysilicon layer disposed over the first gate oxide layer covering the second portion of the semiconductor substrate, the second transistor gate stack being patterned and etched wherein the first polysilicon layer thereof forms a gate electrode for a second bulk pull-down transistor of the second conductivity type formed in the second portion of the semiconductor substrate;

dielectric sidewall spacers disposed about side edges of the second transistor gate stack;

diffusion regions of the second conductivity type in the semiconductor substrate relative to the second transistor gate stack so as to form source and drain regions of the second bulk pull-down transistor;

the second gate oxide layer being formed over the drain region of the second bulk pull-down transistor, the second transistor gate stack and the dielectric sidewall spacers corresponding thereto;

the second polysilicon layer being formed over the second gate oxide layer covering the second transistor gate stack and extending along a side edge thereof and adjacent to the corresponding dielectric sidewall spacer, the second polysilicon layer, the drain region of the second bulk pull-down transistor and the second gate oxide layer corresponding thereto forming a channel region, gate region and gate oxide of a second thin-film pull-up transistor, respectively;

the first bulk pull-down transistor and the second thin-film pull-up transistor forming a first inverter of an SRAM cell; and the second bulk pull-down transistor and the first thin-film pull-up transistor forming a second inverter of the SRAM cell, the first inverter and the second inverter being cross-coupled.

14. The static random access memory cell of claim 1, wherein:

the second polysilicon layer is formed during creation of a strapped contact between the gate of the first bulk pull-down transistor and the drain region of the first thin-film pull-up transistor.

15. The static random access memory cell of claim 6, wherein:

said second polysilicon layer forming the channel of each of said first and said second thin-film pull-up transistors comprises a stringer.

16. A transistor device structure for a static random access memory cell, comprising:

a first diffusion region defined within a semiconductor material, the first diffusion region defining a gate electrode of a thin-film transistor;

a member of a first semiconductor material disposed on the semiconductor material relative to the first diffusion region;

a dielectric spacer formed along a side wall of the member of the first semiconductor material in contact therewith;

an oxide layer formed over the dielectric spacer and at least a portion of the first diffusion region, the oxide layer forming the gate oxide of the thin-film transistor; and a stringer of a second semiconductor material formed over the oxide layer along the dielectric spacer and in contact with a portion of the oxide layer covering an outer side of the dielectric spacer, at least a major portion of the stringer forming a channel of the thin-film transistor;

the thin-film transistor comprising a pull-up transistor for the static random access memory cell.

17. The transistor device structure of claim 16, wherein:

the first semiconductor material comprises a polysilicon material from a first polysilicon layer; and the second semiconductor material comprises a polysilicon material from a second polysilicon layer.

18. The transistor device structure of claim 17, further including:

a second diffusion region defined in the semiconductor material and spaced from the first diffusion region, the second diffusion region forming the source region of a bulk transistor;

wherein the member forms the gate electrode of the first bulk transistor, the first diffusion region forms the drain region of the first bulk transistor, and the bulk transistor comprises a pull-down transistor of the static random access memory cell.

* * * * *